(12) United States Patent
Schmidt et al.

(10) Patent No.: US 7,491,884 B2
(45) Date of Patent: Feb. 17, 2009

(54) HOUSING AND FIELD DEVICE WITH HOOD ENCLOSURE

(75) Inventors: Josef Schmidt, Graben-Neudorf (DE); Gunter Becker, Ostringen (DE); Claus Schopfer, Sandhausen (DE); Klaus Schwesinger, Bruchsalhard (DE)

(73) Assignee: Sew-Eurodrive GmbH & Co. KG, Bruchsal (DE)

( * ) Notice: Subject to any disclaimer, the term of this patent is extended or adjusted under 35 U.S.C. 154(b) by 0 days.

(21) Appl. No.: 10/527,373

(22) PCT Filed: Jul. 24, 2003

(86) PCT No.: PCT/EP03/08126

§ 371 (c)(1),
(2), (4) Date: Mar. 10, 2005

(87) PCT Pub. No.: WO2004/026013

PCT Pub. Date: Mar. 25, 2004

(65) Prior Publication Data

US 2005/0272319 A1    Dec. 8, 2005

(30) Foreign Application Priority Data

Sep. 10, 2002    (DE) .............................. 102 42 178

(51) Int. Cl.
*H02G 3/08* (2006.01)
(52) U.S. Cl. .................. 174/60; 174/564; 439/362; 439/928
(58) Field of Classification Search ......... 439/76.1, 439/76.2, 620.01, 620.21, 620.22, 911, 362, 439/928; 174/50.52, 559, 560, 138 F, 37, 174/38, 50, 60, 61, 64, 564; 361/752, 690, 361/730
See application file for complete search history.

(56) References Cited

U.S. PATENT DOCUMENTS

| 3,429,980 | A |   | 2/1969  | Guttman                    |
|-----------|---|---|---------|----------------------------|
| 3,596,140 | A | * | 7/1971  | Walsh ............... 361/784 |
| 3,641,464 | A | * | 2/1972  | Crowhurst et al. ...... 333/112 |
| 4,327,530 | A |   | 5/1982  | Bush                       |
| 4,424,404 | A | * | 1/1984  | Moore et al. .......... 174/564 |
| 4,746,310 | A | * | 5/1988  | Morse et al. ....... 439/620.13 |
| 5,065,278 | A |   | 11/1991 | Schultz                    |
| 5,069,516 | A | * | 12/1991 | Kohy et al. ........... 385/147 |
| 5,675,300 | A | * | 10/1997 | Romerein ............. 333/100 |
| 5,942,728 | A |   | 8/1999  | Chen                       |
| 6,066,801 | A | * | 5/2000  | Kodaira et al. ......... 174/41 |

(Continued)

FOREIGN PATENT DOCUMENTS

DE    199 05 952    9/2000

*Primary Examiner*—Neil Abrams
(74) *Attorney, Agent, or Firm*—Kenyon & Kenyon LLP (57) ABSTRACT

A field device is made up of a housing including a housing part arranged as a hood, the hood including at least one opening in at least one direction, the housing including at least one connection box including at least one opening in the at least one direction of the at least one opening of the hood; and at least one electronics insert arranged inside the housing. The connection box includes a first plug-in connector and the electronics insert includes a second plug-in connector, the first plug-in connector and the second plug-in connector forming a plug-in connection between the connection box and the electronics insert.

10 Claims, 11 Drawing Sheets

U.S. PATENT DOCUMENTS

| | | | |
|---|---|---|---|
| 6,108,202 A * | 8/2000 | Sumida | 361/690 |
| 6,157,273 A * | 12/2000 | Matsubara | 333/109 |
| 6,649,836 B2 * | 11/2003 | Brechbill et al. | 174/60 |
| 6,790,050 B1 * | 9/2004 | Roth-Stielow et al. | 439/76.2 |
| 7,229,325 B1 * | 6/2007 | Flynn et al. | 439/814 |

* cited by examiner

HOUSING AND FIELD DEVICE WITH HOOD ENCLOSURE

FIELD OF THE INVENTION

The present invention relates to a housing and a field device.

BACKGROUND INFORMATION

Electrical devices that are used in industrial facilities in the field are also exposed to dirt, dust, water and other substances. This frequently results in failures.

SUMMARY

An example embodiment of the present invention may provide a housing and a field device that may be usable in a high protection class and that may nevertheless be produced in a cost-effective manner. In particular, electronics may also be protectable and connectable in the field, e.g., in the case of spray water, for example.

In an example embodiment of the present invention, the housing may include a housing part designed as a hood, and the hood may have at least one opening in one direction, e.g., in the direction of gravity, e.g., at the bottom.

A quick and simple assembly may be made possible, imperviousness may be provided, and the housing as well as the three-part field device may be produced in a cost-effective manner. In addition, assembly and maintenance may be performed in a simple and cost-effective manner. In the case of a possible replacement of defective components, such replacement may be performed in a simple and rapid manner. Such a replacement may be performed not only mechanically but also in terms of information technology. Due to the at least three-part construction, the parameterizing effort required following a replacement of electronic components may be significantly reduced. This is because of, e.g., the at least three-part construction of the housing, which, in case of a defect, allows for a quick mechanical replacement of the hood together with the electronics insert, while in the stationary lower part, which includes the connection terminals for electrically connectable devices, a data storage unit may be provided, which holds the characteristic data, parameters or merely a characteristic address on hand and ready for retrieval. Already from the address information alone, the electronics insert is able to retrieve via a data bus the parameters and additional parameterizing data stored in a central computer and thus able to perform its own parameterization automatically. Substantial time savings may be achieved in this manner, e.g., compared to conventional devices, in which field devices may have to have a specially provided interface via which the data are to be imported during parameterization.

In additional example embodiments of the present invention, the housing may be constructed as one piece. A high protection class and a high degree of imperviousness may thus be achieved.

In example embodiments of the present invention, the hood may only have one or more openings downwardly, e.g., in the direction of gravity. Thus, no water may reach the electronics insert, even if the entire facility is exposed to flooding.

In example embodiments of the present invention, the hood may be shaped such that water drains away, e.g., under the influence of gravitation, without water being able to collect in one place at the hood. This may reduce the danger of corrosion.

In example embodiments of the present invention, the hood may be produced by deep drawing, e.g., from sheet metal, by pressure diecasting, by injection molding, etc. The hood may thus be produced in a cost-effective manner.

In example embodiments of the present invention, the hood may include a lower and an upper hood part, the upper hood part being designed with a vaned profile, e.g., for forming a heat sink and/or for improved dissipation of heat to the environment. Thus, even one or more electronic circuits, e.g., as converters power a motor, may be integrated in the electronics insert.

In example embodiments of the present invention, the lower and the upper hood parts may be designed as one piece. It is thus possible that a high degree of imperviousness and a high protection class may be achieved.

In example embodiments of the present invention, the electronics insert may be imperviously joined to the inner side of the hood. The hood together with the electronics insert may be quickly replaced in maintenance or repair cases. The purely mechanical connection terminals, by contrast, are located in the connection box and thus may not have to be replaced in the case of a defective electronics insert. This may make it possible to reduce costs.

In example embodiments of the present invention, the electronics insert may have a plug-in connector unit in the direction of the connection box. This may allow for a quick and simple connection.

In example embodiments of the present invention, the plug-in connector unit may include a sealed arrangement. In particular, the plug-in connector unit may have molded-in contact pins for sealing, the plug-in connector unit being connected to the electronics insert by a seal. Thus, the electronics insert may be provided with the sealing of a high protection class.

In example embodiments of the present invention, the housing may include at least one electronics insert and at least one connection box. In particular, the electronics insert may be joined by friction-locking to the hood, e.g., to its upper part. Thus, the electronics insert and the hood may even be joined so as to form a seal in a simple and cost-effective manner. In particular, an additional seal may also be provided between the hood and the electronics insert.

In example embodiments of the present invention, the electronics insert may be joined by form-locking and friction-locking to a mounting support, which is clasped by the upper part of the hood. In this manner, it may be possible to provide not only floor mounting, but wall mounting as well.

In example embodiments of the present invention, the electronics insert may include first plug-in connectors, e.g., plug-in connector units, in the direction of gravity. The connection box may have second plug-in connectors, e.g., corresponding plug-in connector units for connecting to the first plug-in connectors.

In example embodiments of the present invention, the connection box may have openings for feeding in cables on the lower side, e.g., in the direction of gravity. The hood may also protect these cable feeds against at least vertically falling rain. For this purpose, the hood may be arranged so that its lower edge is extended out over the connection box, thus improving protection against rain.

In example embodiments of the present invention, the connection box may be joined to the hood in a form-locking and impervious manner, e.g., with the aid of an interposed seal. The electronics insert may have at least two seals for an impervious connection to the hood, e.g., at its circumference and on the plug-in connector.

In example embodiments of the present invention, the field device may be arranged for decentralized use in an industrial facility. Thus, the field device may be arranged to have an electronics insert that includes PC functionality and may be installed and operated in the field, e.g., also in a wet zone, for example. In place of PC functionality, converter functionality for powering electric motors may also be integrated into the electronics insert. The heat of the power output stage of the converter may be dissipated to the environment via the hood specially fitted with cooling vanes.

Further features and aspects are described below.

LIST OF REFERENCE NUMERALS

11 Hood
12 Mounting support
13 Mounting plate
14 Wall
20 Electronics insert
21 First plug-in connectors
22 Seal
29 Threaded rods
30 Connection box
31 Second plug-in connectors
32 Form-locking region
33 Seals
34 Quick-change fastener
35 Lower side of housing
36 Cable feed
37 Connecting terminals
38 Side plate
41 Hood
42 Cooling vanes
43 Mounting plate
44 Fastening bolt
45 Hinged housing part of the connection box
46 Guide rail
47 Plug-in connector unit
48 PG cable glands for low voltage
49 PG cable glands for power supply
50 Lower housing part of the connection box
51 Additional housing part of the connection box
52 Connection terminals
61 Hood
62 Device switch
63 Additional housing part of the connection box
64 Housing part Example embodiments of the present invention are explained in more detail below with reference to the appended Figures.

BRIEF DESCRIPTION OF THE DRAWINGS

FIGS. 7 to 9 schematically illustrate an exemplary embodiment of the present invention. In this context.

DETAILED DESCRIPTION

The field device has a housing construction of a high protection class and may thus be especially suited for the installation of decentralized control technology in the field of an industrial facility.

In its overall construction, the field device has a structure made up of at least three parts, including a housing part designed as hood 11, an electronics insert 20 and a connection box 30. Downwards, e.g., in the direction of gravity, connection box 30 additionally has the function of forming the housing.

The electronic circuit is arranged as a converter electronics circuit. In example embodiments of the present invention, other electronic circuits may be provided as well, for example, control electronics, switching-function electronics for a motor, smooth-start device electronics, etc.

Hood 11 has a one-part arrangement and has no opening in the upward or in the lateral direction. Only a downward opening, e.g., in the direction of gravity, is provided. Thus, in flood conditions, for example, only a certain portion of the interior volume in the lower region of the lower part of the hood may be flooded, if seals and other provided measures should fail.

Hood 11 is deep-drawn from sheet metal or produced by pressure diecasting or injection molding. At least in its upper part, hood 11 is provided with a vaned profile for cooling the electronics. In an exemplary embodiment of the present invention as illustrated in FIGS. 1, 2, 3, 6, the vaned profile is arranged to extend across the entire length of the hood.

In exemplary embodiments of the present invention, the hood is formed, the cooling vanes are arranged, and the mounting direction is selected such that water or other liquids may run off unimpeded on the outside of the hood. Thus, there are no depressions, etc., where water may collect. This may increase corrosion protection.

Electronics insert 20 includes an electronic circuit and is fastened to connection box 30 by threaded rods 29 and nuts 34. In example embodiments of the present invention, fastening may also be provided by friction-locking, e.g., also in the upper half of the hood. For example, a bayonet lock may also be used.

Heat transfer to hood 11 may be ensured at least via form locking and/or friction locking. An additional screw joint is optionally possible. Contacting occurs via plug-in connection 21.

Connection box 30 is connected to electronics insert 20 via a plug-in connection, which is made up of first plug-in connector 21 and second plug-in connector 31.

The electronics insert may also have seals 22 for producing an impervious connection with the hood.

Cable feed 36 leading to electronics insert 20 is provided on the underside of connection box 30. Depending on protection class and requirement, exemplary embodiments of the present invention may provide for cable feed 36 to be implemented from below via plug-in connectors or PG cable glands. The Figures illustrate PG cable glands 36 in bottom side of housing 35 of the connection box.

The side walls of the connection box are joined to the interior walls of hood 11 in a form-locked manner, e.g., with a precise fit. This joining may produce a certain imperviousness, e.g., to dust, etc. The imperviousness for attaining a high protection class may be achieved with the aid of seals 33.

In exemplary embodiments of the present invention, a maintenance switch may be optionally integrated into connection box 30 from below.

Fastening for connection box 30 is provided via an integrated mounting support. The cable routing for the electrical connections is fed through mounting support 13 from below. In exemplary embodiments of the present invention, it may also be led through laterally. Mounting support 13 also has an elongated hole for a futher optional cable lead-through.

Assembly occurs following the manufacture of electronics insert 20 in that the latter is preassembled in the hood, which may then be slipped onto the connection box.

Contacting occurs via first and second plug-in connectors (21, 31). Connection box 30 is bolted to the hood from below by a quick-change fastener 34. A bayonet lock may be used for this purpose.

To provide sealing, the mounting position of the hood is such that the hood is mounted downwardly, e.g., in the direction of gravity. This may ensure that any liquid from above and from all four sides will drip off via the hood. Connection box 30 is protected by this principle as well. Only the bottom side for the cable feed may come into contact with liquid, for example, in the case of flooding.

With the aid of connection box 30, bottom side of housing 35 is protected by sealing, form-locked connection 32 to the hood and two additional seals 33.

The hood having mounted electronics 20 is made impervious to dust by virtue of the form-locked connection of the electronics insert with the hood and sealing surface 22. Thus, the electronics are even protected in the unmounted state.

Connection box 30 is itself arranged to be impervious to dust.

The heat of the electronic circuit of the electronics insert is dissipated via upper hood part 11 and the cooling vanes embossed therein. Lower hood part 10 may stay cooler.

The drainage of condensed water in the connection box may be ensured by the structural design. Connecting terminals 37 are attached so as to be spatially separated from the condensed water collection area.

Figure 1:
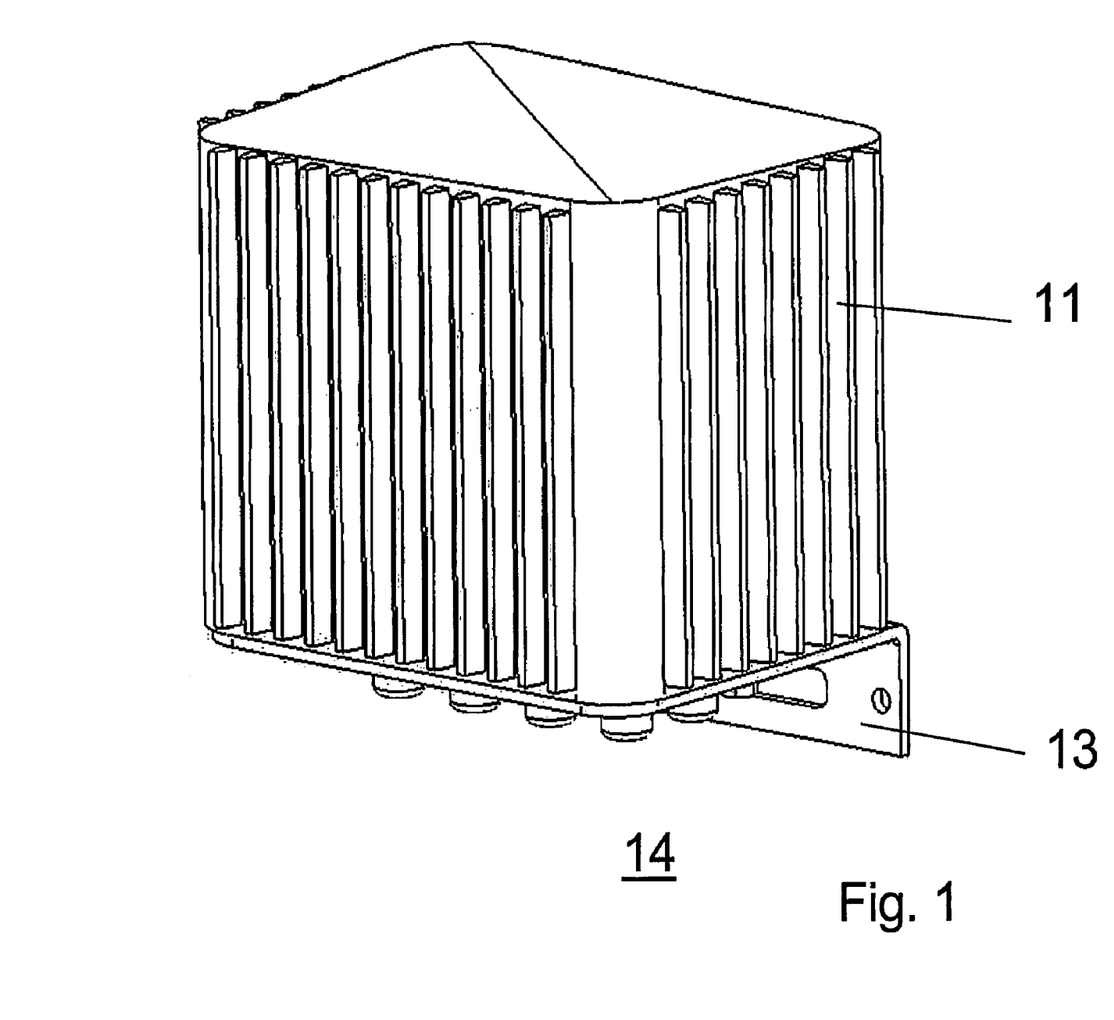
FIG. 1 illustrates a field device mounted to a wall.
Figure 2:
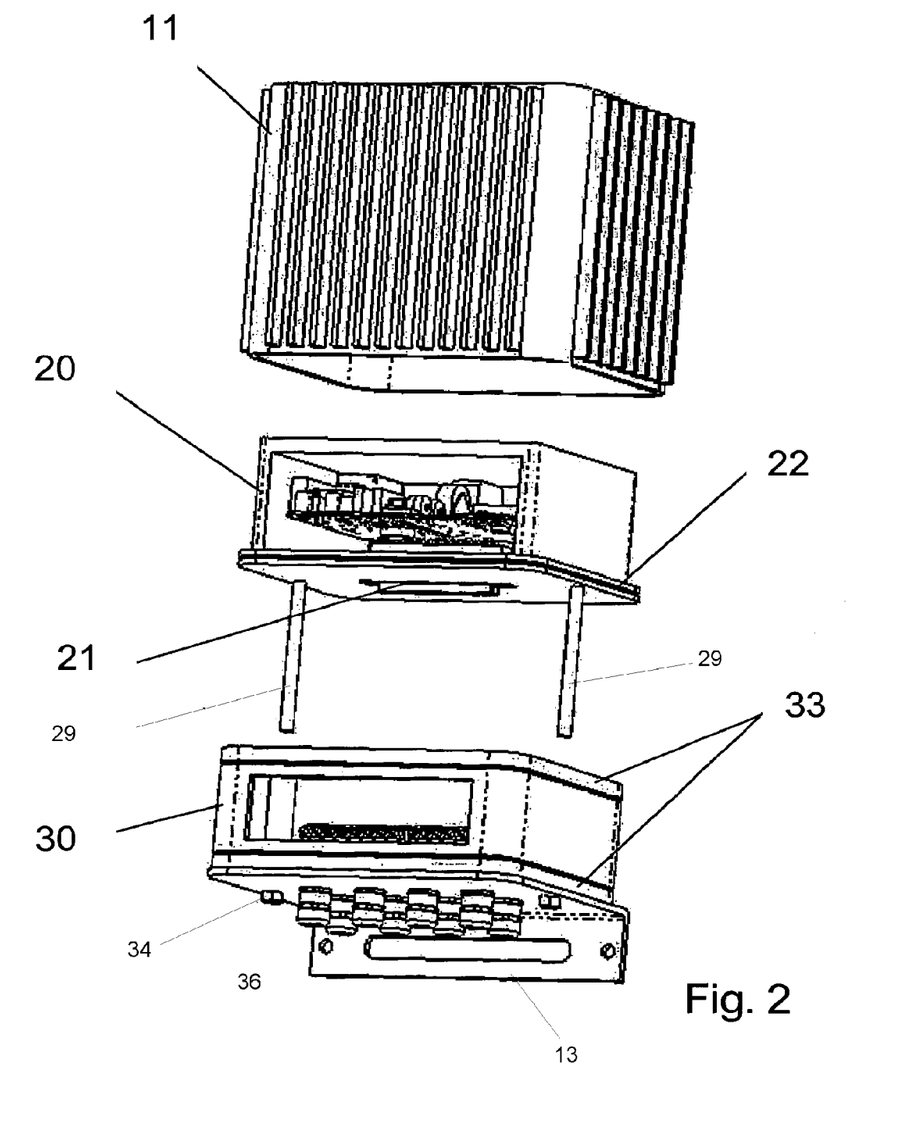
FIG. 2 illustrates a field device in an exploded view, where the connection box, the electronics insert and the housing part in the form of a hood are illustrated.
Figure 3:
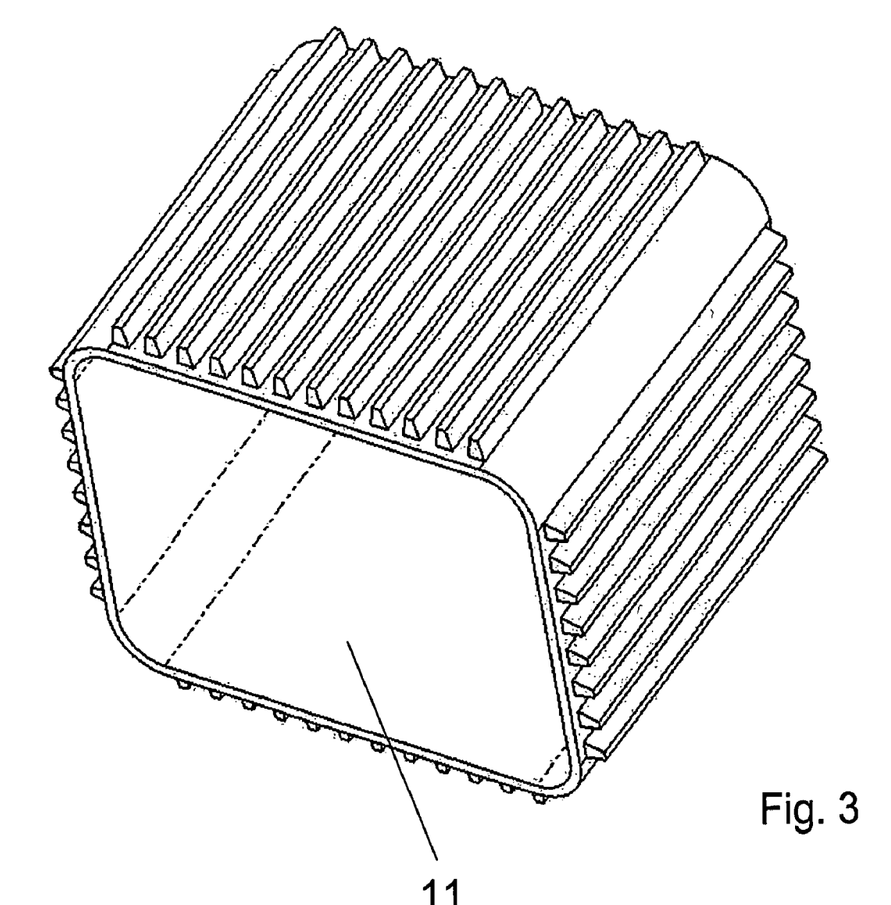
FIG. 3 illustrates a hood.
Figure 4:
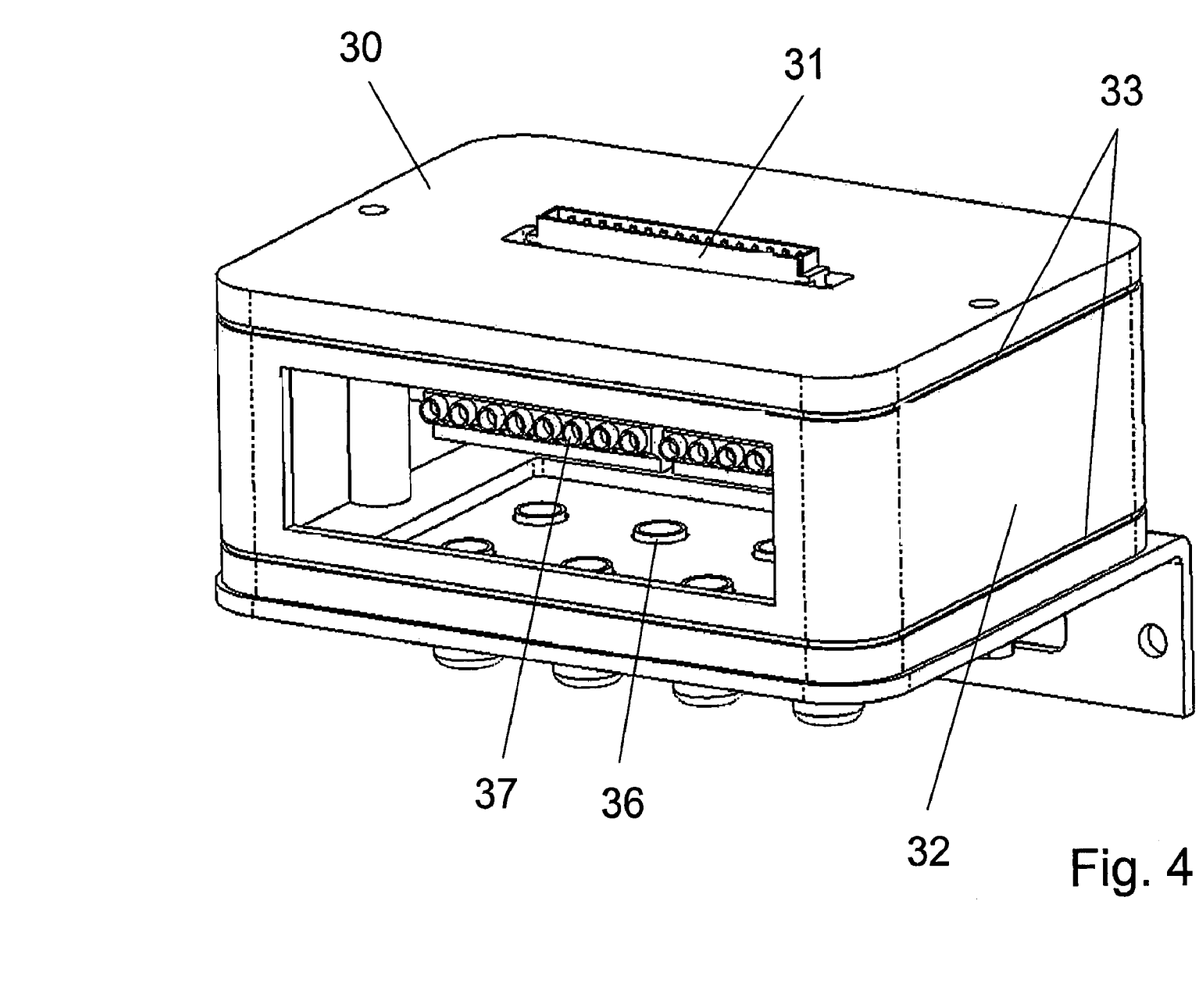
FIG. 4 illustrates a connection box with the side plate lifted off laterally.
Figure 5:
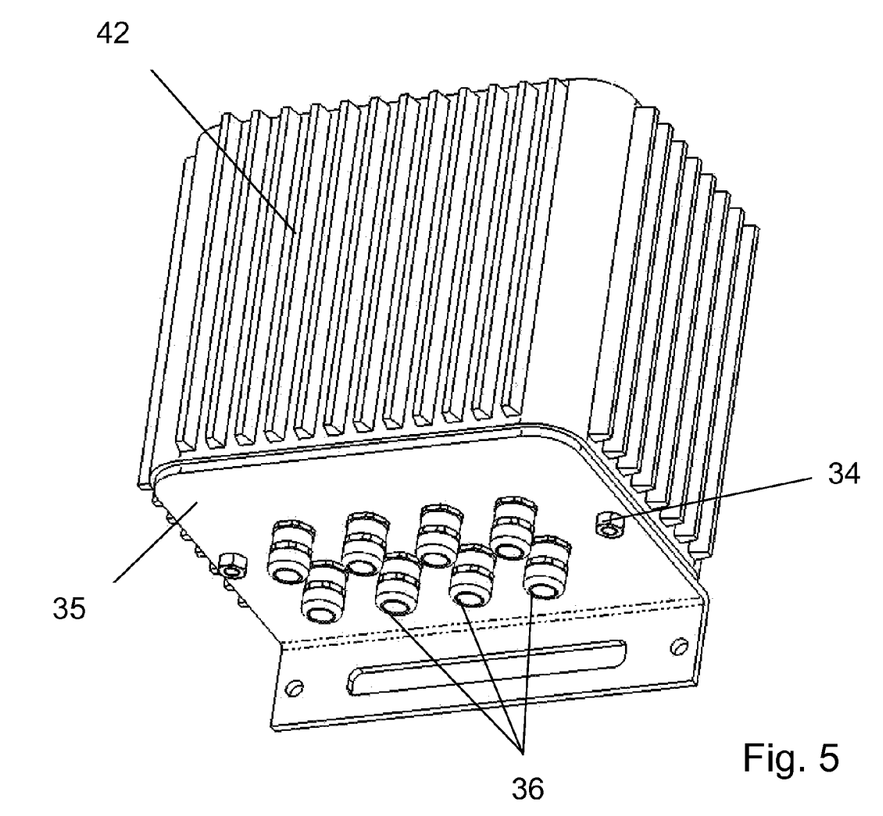
FIG. 5 illustrates a field device from a different angle.
Figure 6:
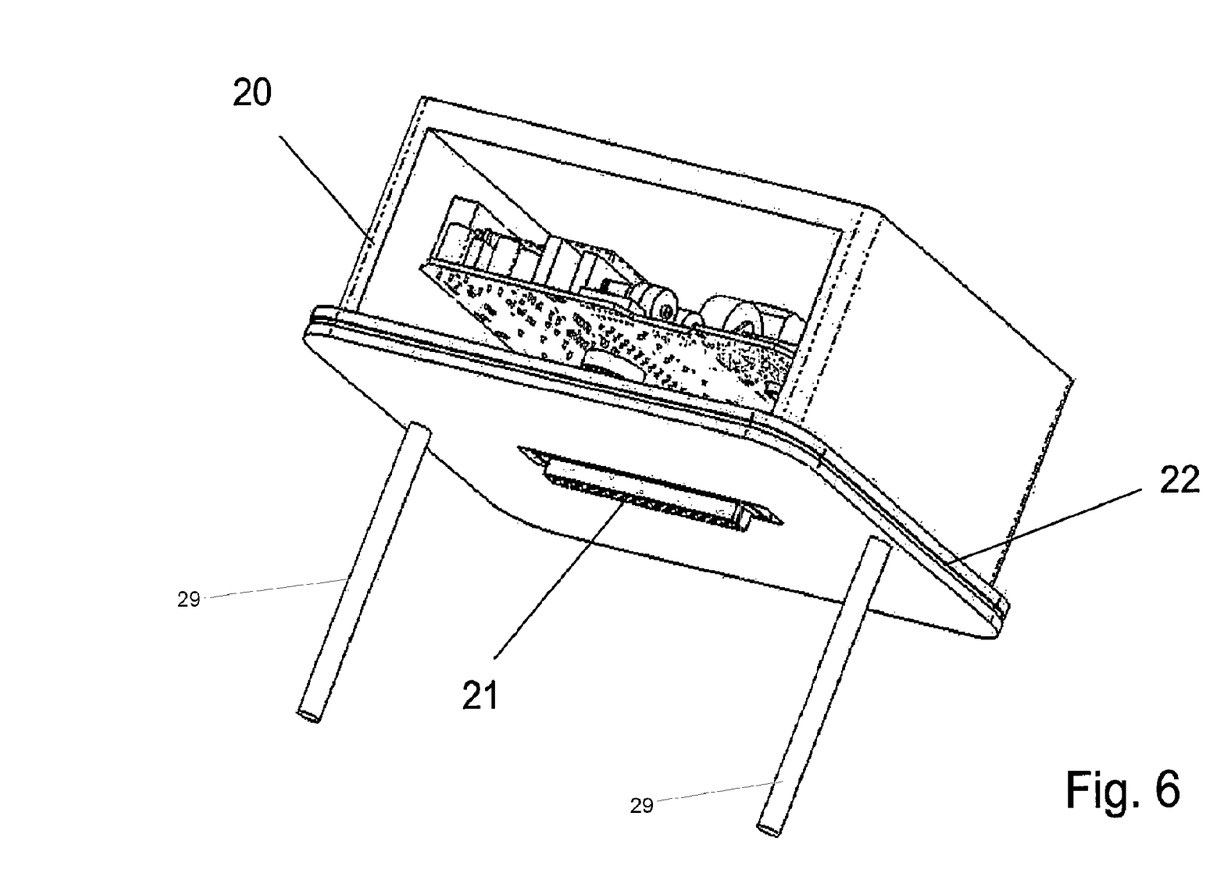
FIG. 6 illustrates an electronics insert.
Figure 7:
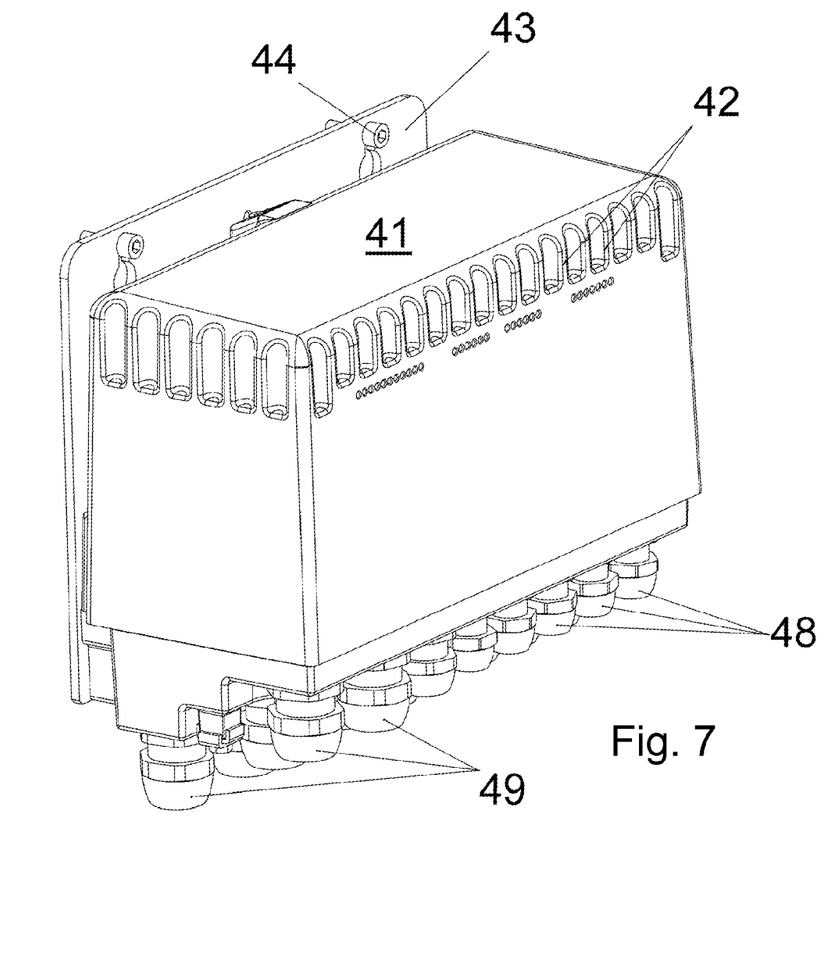
FIG. 7 illustrates a field device.
Figure 8:
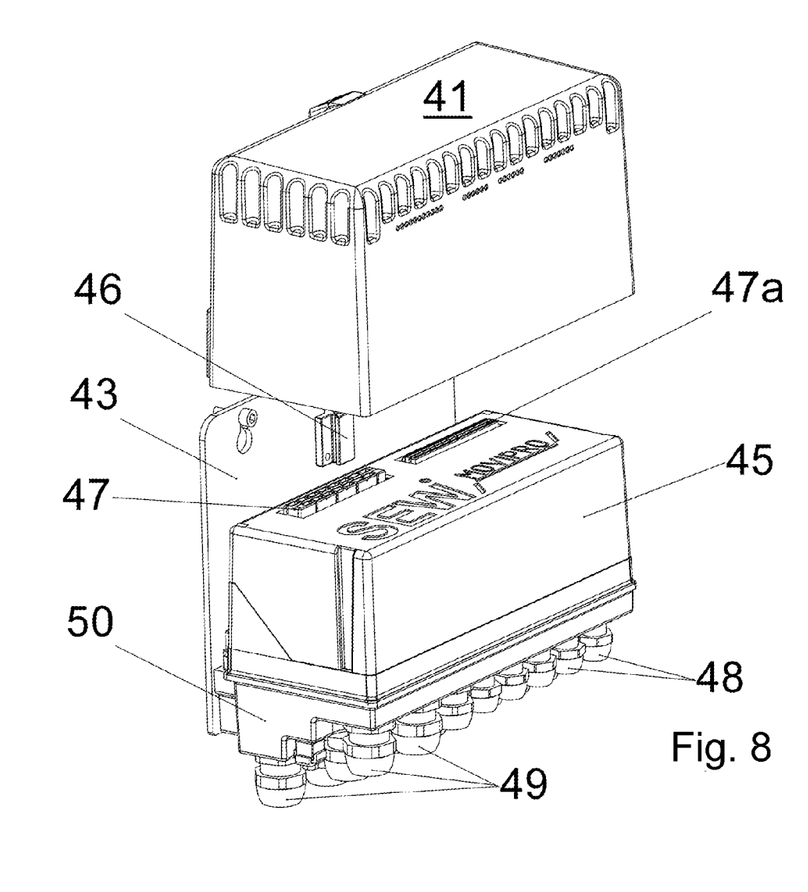
FIG. 8 illustrates a hood 41 lifted off.
Figure 9:
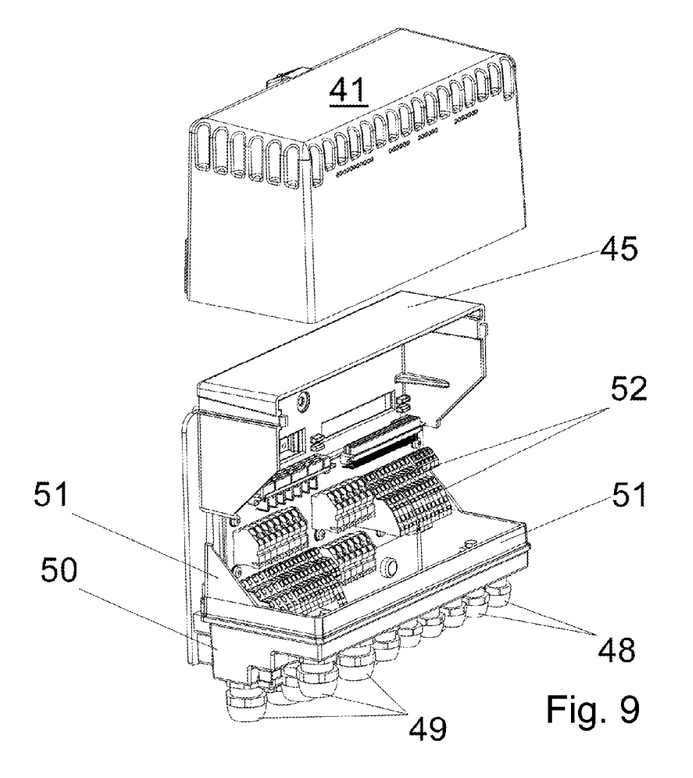
FIG. 9 illustrates one housing part opened.

FIGS. 7 to 9 schematically illustrate an exemplary embodiment of the present invention.

In this context, FIG. 7 illustrates the field device. FIG. 8 illustrates hood 41 lifted off, an electronics insert in the hood being joined to it. FIG. 9 illustrates one housing part opened.

Hood 41 is provided with cooling vanes 42. These are shaped such that water may always run off and may not remain anywhere.

In exemplary embodiments of the present invention, cooling vanes 42 may extend all the way through from top to bottom.

As illustrated in FIGS. 7 to 9, the field device may be mounted to a wall by its mounting plate 43 joined to the connection box, and by fastening bolt 44 inserted through the recesses of the mounting plate. Mounting plate 43 also has a guide rail 46, which may simplify and facilitate the mounting of hood 41 of the field device.

The connection box is made up of a lower housing part 50, a further housing part 51 mounted on top of it and another housing part 45 attached to the latter in a pivoted manner such that it may be opened.

The connection box has plug-in connector units 47 and 47a, by which connection terminals 52 located in the connection box may be electrically connected to the electronics insert, which, as illustrated in FIGS. 7 to 9 is already located inside hood 41. The electronics insert has corresponding plug-in connector units that have a sealed arrangement. The plug-in connector unit has molded-in contact pins, the plug-in connector unit being connected by a seal to the electronics insert.

Mounted to its lower housing part 50, the connection box has PG cable glands 48 for low voltage and PG cable glands 49 for power supply. Thus, cables coming from other devices may be connected to connection terminals 52 in an impervious manner.

Figure 10:
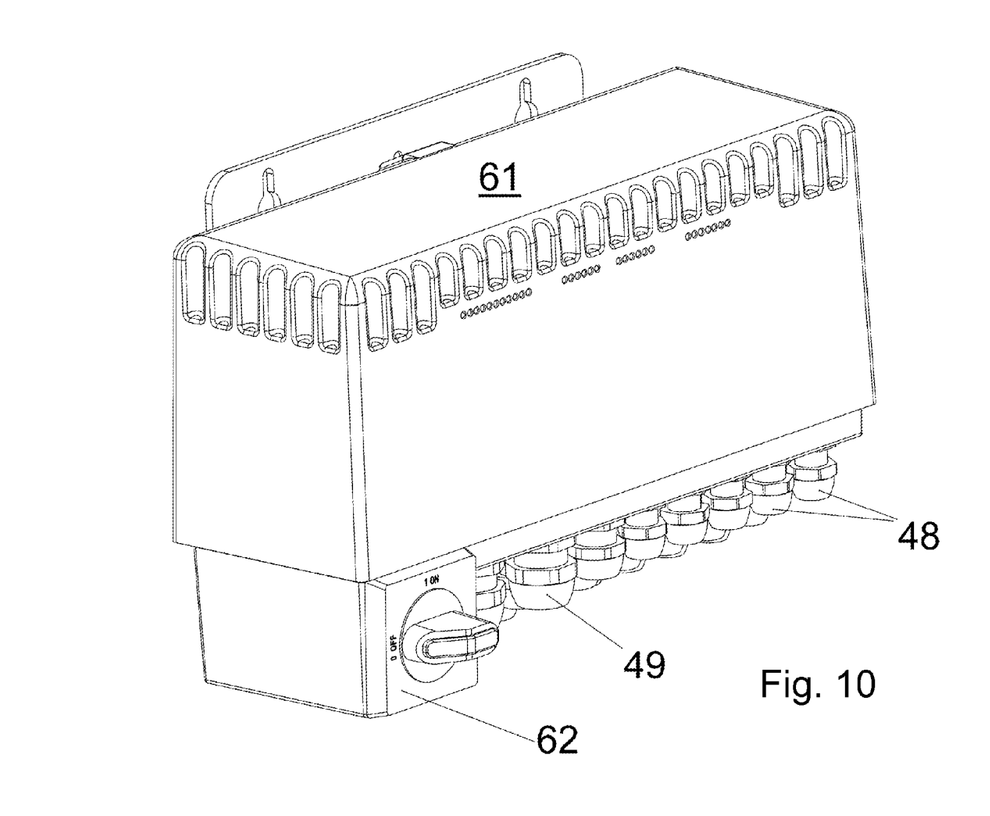
FIGS. 10 and 11 illustrate an exemplary embodiment of the present invention, in which a device switch is provided.
Figure 11:
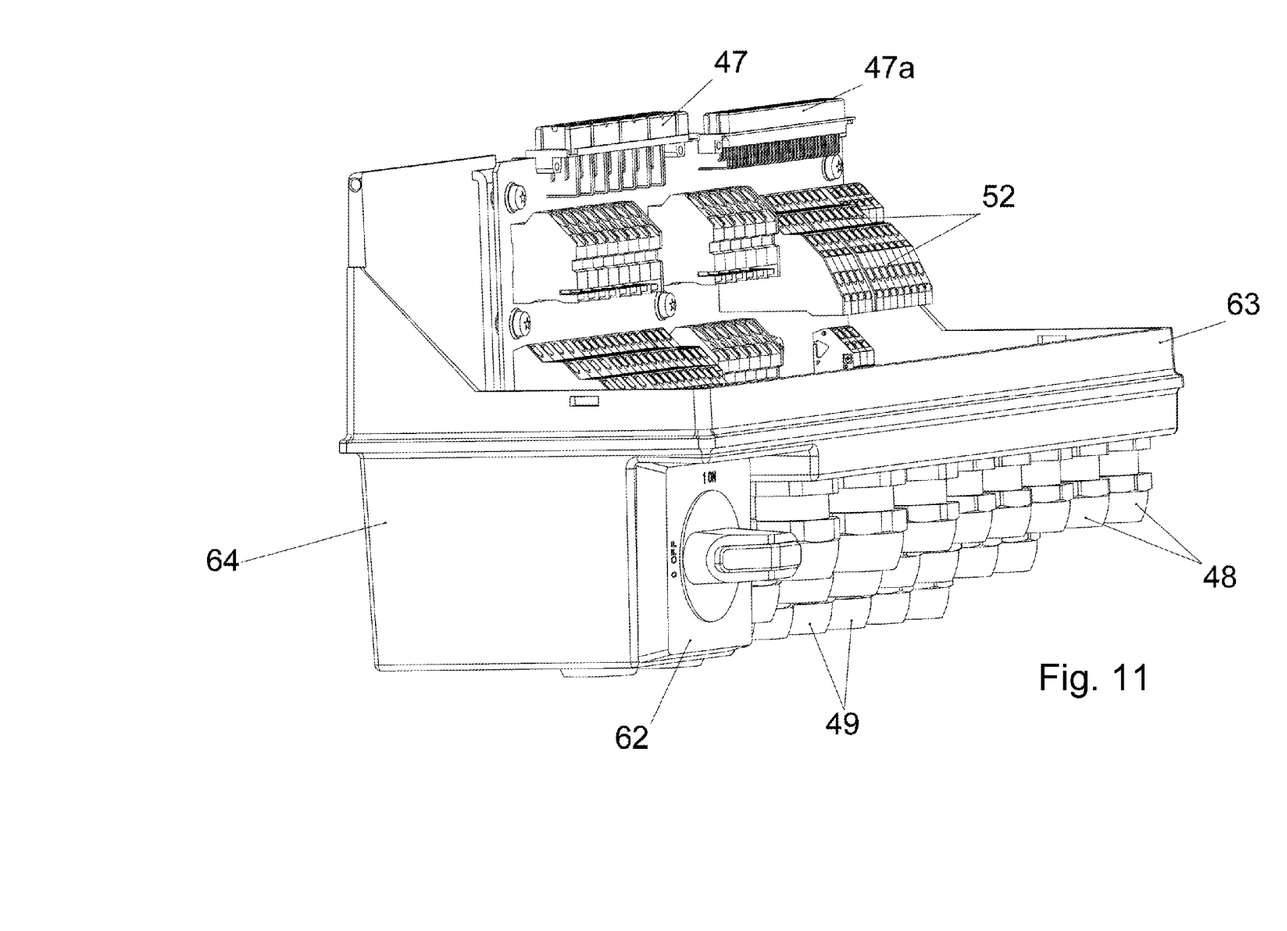

FIGS. 10 and 11 illustrate an exemplary embodiment of the present invention. A device switch 62 having a housing part 64 that is joined to the other housing part 63 of the connection box of the field device is attached to the connection box. The switch is arranged to be impervious, e.g., to be in a high protection class and watertight. The protection class may also be IP64 or higher. Remaining components may be similar to the components of the exemplary embodiment illustrated in FIGS. 7 to 9. The device switch may also be suited for maintenance.

The electronics insert may also be arranged to have converter functionality. The power electronics are connected in a heat-conducting manner to the hood, the heat being able to dissipate via the cooling vanes. The electric motor, electrically connected to the electronics insert via the connection terminals of the connection box, is powered by the converter circuit of the electronics insert. Furthermore, the electronics insert has connections for inputs and outputs for connecting sensors and/or actuators via the connection terminals of the connection box. In addition, supply lines, such as 24 V and field bus lines, may be connected as well. Field bus lines, power supply lines, e.g., high-voltage lines, and supply lines, e.g., 24 V lines, are wired in a T-shaped manner in the connection box. Thus, additional field devices may be electrically connected in a serial manner.

An electronic data storage unit having long-term stability, for example, an EEPROM, is also provided in the connection box. Thus, an address may be stored, and during initial operation and parameterization, the electronics insert is able to obtain the data intended for this address from a central control system via the field bus, and may therefore be parameterized in a rapid and simple manner. Presetting information may also be stored in the data storage unit.

The connection box may be joined to the facility in a fixed and/or detachable manner. Thus, in case of faults in the electronics, only the hood together with the electronics insert may need to be exchanged.

Another aspect of the connection box is that, depending on the customer and the facility, it may be possible definitively to stipulate a wiring that is specific to this facility. Thus, it may be possible to supply always the same field device for different facilities with the appropriate wiring. For this purpose, the connection box may also be configured to have a patch board between the terminal strip for the connection terminals and the PG cable glands.

What is claimed is:

1. A field device, comprising:
a housing including a housing part arranged as a hood, the hood including at least one opening in at least one direction, the housing including at least one connection box including at least one opening in the at least one direction of the at least one opening of the hood;
at least one electronics insert arranged inside the housing;
wherein the connection box includes a first plug-in connector and the electronics insert includes a second plug-in connector, the first plug-in connector and the second plug-in connector forming a plug-in connection between the connection box and the electronics insert;

wherein the connection box has cable-feed openings on a lower side;

wherein the electronics insert is form-locked to the connection box; and wherein the electronics insert is joined to an inner side of the hood to form a seal.

2. The field device according to claim 1, wherein at least one of: (a) the direction is a direction of gravity; (b) the housing is arranged as one piece; (c) the hood includes at least one downward opening; (d) the hood includes at least one downward opening in the direction of gravity; (e) the hood is shaped to drain away water; (f) the hood is shaped to drain away water, in accordance with by a force of gravity, without water collecting in a place at the hood; (g) the hood is produced by deep drawing; (h) the hood is formed of sheet metal; (i) the hood is produced by pressure diecasting; and (j) the hood is produced by injection molding.

3. The field device according to claim 1, wherein the hood includes a lower hood part and an upper hood part, at least one of (a) the upper hood part including a vaned profile and (b) the lower hood part and the upper hood part arranged as one piece.

4. The field device according to claim 1, wherein the hood includes a lower hood part and an upper hood part configured to at least one of (a) a heat sink and (b) to dissipate to an environment.

5. The field device according to claim 1, wherein the electronics insert is joined to an upper hood part.

6. The field device according to claim 1, wherein at least one of (a) at least one of the plug-in connectors includes a sealed configuration; (b) at least one of the plug-in connectors includes molded-in contact pins configured to seal; (c) at least one of the plug-in connectors is joined by a seal to the connection box; (d) the connection box includes at least one electronic data storage unit; and (e) the electronic data storage unit is configured to store data permanently.

7. The field device according to claim 1, wherein at least one of (a) the electronics insert is frictionally connected to the hood; (b) the electronics insert is frictionally connected to an upper part of the hood; (c) the electronics insert is form-locked and frictionally connected to a mounting support, which is clasped by the upper part of the hood; (d) the first plug-in connectors are arranged in a direction of gravity; (e) the opening of the connection box is arranged to feed cable on a bottom side; (f) the opening of the connection box is arranged to feed cable on the bottom side in a direction of gravity; and (g) the connection box is joined to the hood form-lockingly and imperviously.

8. The field device according to claim 1, wherein the connection box includes two seals adapted to form a sealed connection to the hood.

9. The field device according to claim 1, wherein the field device is configured for decentralized use in an industrial facility.

10. The field device according to claim 1, wherein the electronics insert is at least one of (a) arranged as a converter and (b) is configured to electrically connect to a converter.

* * * * *